(12) United States Patent
Lutz et al.

(10) Patent No.: US 9,076,688 B1
(45) Date of Patent: Jul. 7, 2015

(54) SCATTEROMETRY FOR NESTED AND ISOLATED STRUCTURES (71) Applicant: GLOBALFOUNDRIES Inc., Grand Cayman (KY)

(72) Inventors: Robert Lutz, Dresden (DE); Robert Melzer, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/202,675

(22) Filed: Mar. 10, 2014

(51) Int. Cl.
*H01L 21/66* (2006.01)

(52) U.S. Cl.
CPC ............ *H01L 22/12* (2013.01); *G01B 2210/56* (2013.01)

(58) Field of Classification Search
USPC ......................................................... 438/14
See application file for complete search history.

(56) References Cited

U.S. PATENT DOCUMENTS

| | | | |
|---|---|---|---|
| 2005/0258365 A1* | 11/2005 | Bloess et al. ................... | 250/309 |
| 2011/0085162 A1* | 4/2011 | Verstappen et al. ....... | 356/237.5 |
| 2011/0085176 A1* | 4/2011 | Cramer et al. ................ | 356/601 |
| 2011/0098992 A1* | 4/2011 | Van Beurden et al. ........... | 703/2 |
| 2011/0218789 A1* | 9/2011 | Van Beurden .................. | 703/13 |
| 2012/0123748 A1* | 5/2012 | Aben et al. ........................ | 703/2 |
| 2014/0234993 A1* | 8/2014 | Li et al. ........................... | 438/16 |

\* cited by examiner

*Primary Examiner* — Asok K Sarkar
(74) *Attorney, Agent, or Firm* — Ditthavong & Steiner, P.C.

(57) ABSTRACT

Methodologies and an apparatus for enabling scatterometry to be used to estimate dimensions of fabricated semiconductor devices are provided. Embodiments include initiating scatterometry on a fabricated test structure comprising a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction. A scattering spectra corresponding to one or more physical characteristics of the fabricated test structure based on results of the scatterometry is determined. The scattering spectra is associated with the one or more physical characteristics in a library for estimating at least one physical dimension of a fabricated structure.

20 Claims, 8 Drawing Sheets

SCATTEROMETRY FOR NESTED AND ISOLATED STRUCTURES

TECHNICAL FIELD

The present disclosure relates to methods and an apparatus for estimating dimensions of fabricated semiconductor devices. The present disclosure is particularly applicable to the estimation of critical dimensions (e.g., trench depth) for shallow trench isolation (STI) etch and chemical mechanical polishing (CMP) characterization for both nested structures of static random access memories (SRAM) and isolated structures of logic areas.

BACKGROUND

Scatterometry is used to estimate dimensions of fabricated structures, such as trench depth, trench sidewall angle, height of step of shallow trench isolation oxide above silicon surface. Typical scatterometry methods utilize a rectangular array having closely-spaced (e.g., nested), alternating lines and trenches in a grid. Results of such a scatterometry are highly applicable to SRAMs. However, such scatterometry methods neglect isolated structures, for instance, found in logic areas of fabricated semiconductor devices. Moreover, some characteristics of such isolated structures may not be extrapolated from measurements of nested structures. Accordingly, such results may be inapplicable to logic areas.

A need therefore exists for methodology and an apparatus for enabling scatterometry to be used to estimate dimensions for both SRAM and logic areas of fabricated semiconductor devices.

SUMMARY

An aspect of the present disclosure is a method including performing scatterometry on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction.

Another aspect of the present disclosure is an apparatus configured to initiate scatterometry on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: initiating scatterometry on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, the second distance being substantially larger than the first distance; determining, by a processor, a scattering spectra corresponding to one or more physical characteristics of the fabricated test structure based on results of the scatterometry; and associating the scattering spectra with the one or more physical characteristics in a library for estimating at least one physical dimension of a fabricated structure.

Aspects of the present disclosure include a method, wherein the one or more physical characteristics include a topography of an upper surface of the fabricated test structure along the horizontal or the vertical direction. Some aspects include a method, wherein each of the features includes an active region layer and a hardmask layer on the active region layer. Further aspects include a method, wherein the one or more physical characteristics include a height of at least one of the active region layers along the horizontal or vertical direction, a combined height of at least one of the active region layers and a respective hardmask layer along the horizontal or vertical direction, a width of an upper surface of at least one of the hardmask layers along the horizontal or vertical direction, a width of an upper surface of at least one of the active region layers along the horizontal or vertical direction, a sidewall angle of at least one of the hardmask layers along the horizontal or vertical direction, a sidewall angle of at least one of the active region layer along the horizontal or vertical direction, or a combination thereof. Additional aspects include a method, wherein the narrow and isolation trenches correspond to shallow trench isolation regions separating active regions of a SRAM and a logic area, respectively. Some aspects include a method, wherein the one or more physical characteristics include a height of at least one of the narrow trenches along the horizontal direction, a horizontal width between upper surfaces of hardmasks of adjacent features along the horizontal direction, a height of at least one of the isolation trenches along the vertical direction, a vertical width between upper surfaces of hardmasks of adjacent features along the vertical direction, or a combination thereof. Further aspects include: forming an oxide in the isolation and narrow trenches, removing the hardmask layers to expose a surface of the active regions of each of the features, and initiating a second scatterometry after forming the oxide and removing the hardmask layers. Additional aspects include: the scatterometry being a two-dimensional scatterometry; and the features being rectangular with each side having a width of between 20 nanometer (nm) and 1000 nm, wherein the first distance is 50 nm to 100 nm and the second distance is greater than 400 nm.

Another aspect of the present disclosure is an apparatus including: a processor; and memory including computer program code for a program, the memory and the computer program code configured to, with the processor, cause the apparatus to perform at least the following, initiate scatterometry on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, the second distance being substantially larger than the first distance; determine a scattering spectra corresponding to one or more physical characteristics of the fabricated test structure based on results of the scatterometry; and associate the scattering spectra with the one or more physical characteristics in a library for estimating at least one physical dimension of a fabricated structure.

Aspects include an apparatus, wherein the one or more physical characteristics includes a topography of an upper surface of the fabricated test structure along the horizontal or the vertical direction. Some aspects include an apparatus, wherein each of the features includes an active region layer and a hardmask layer on the active region layer. Further aspects include an apparatus, wherein the one or more physical characteristics include a height of at least one of the active region layers along the horizontal or vertical direction, a combined height of at least one of the active region layers and a respective hardmask layer along the horizontal or vertical direction, a width of an upper surface of at least one of the hardmask layers along the horizontal or vertical direction, a width of an upper surface of at least one of the active region layers along the horizontal or vertical direction, a sidewall angle of at least one of the hardmask layers along the horizontal or vertical direction, a sidewall angle of at least one of the active region layer along the horizontal or vertical direction, or a combination thereof. Some aspects include an apparatus, wherein the narrow and isolation trenches correspond to shallow trench isolation regions separating active regions of a SRAM and a logic area, respectively. Additional aspects include an apparatus, wherein the one or more physical characteristics include a height of at least one of the narrow trenches along the horizontal direction, a horizontal width between upper surfaces of hardmasks of adjacent features along the horizontal direction, a height of at least one of the isolation trenches along the vertical direction, a vertical width between upper surfaces of hardmasks of adjacent features along the vertical direction, or a combination thereof. Further aspects include an apparatus, wherein the apparatus is further caused to form an oxide in the isolation and narrow trenches, remove the hardmask layers to expose a surface of the active regions of each of the features, and initiate a second scatterometry after forming the oxide and removing the hardmask layers. Some aspects include an apparatus, wherein the scatterometry is a two-dimensional scatterometry, and the features are rectangular with each side having a width of between 20 nm and 1000 nm, wherein the first distance is 50 nm to 100 nm and the second distance is greater than 400 nm.

Another aspect of the present disclosure is a method including: initiating a two-dimensional scatterometry on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, wherein the second distance is substantially larger than the first distance, and the narrow and isolation trenches correspond to shallow trench isolation regions separating active regions of a SRAM and a logic area, respectively, of a fabricated structure; determining, by a processor, a first scattering spectra corresponding to a first topography of an upper surface of the fabricated test structure along the horizontal direction based on results of the scatterometry; determining, by the processor, a second scattering spectra corresponding to a second topography of an upper surface of the fabricated test structure along the vertical direction based on results of the scatterometry; and associating the first scattering spectra and second scattering spectra with the first and second topographies, respectively, in a library for estimating at least one physical dimension of the SRAM and/or logic area.

Aspects include a method, wherein the first topography and/or second topography include one or more of the following: a height of at least one of the active region layers along the horizontal or vertical direction; a combined height of at least one of the active region layers and a respective hardmask layer along the horizontal or vertical direction; a width of an upper surface of at least one of the hardmask layers along the horizontal or vertical direction; a width of an upper surface of at least one of the active region layers along the horizontal or vertical direction; a sidewall angle of at least one of the hardmask layers along the horizontal or vertical direction; a sidewall angle of at least one of the active region layer along the horizontal or vertical direction, or a combination thereof; a height of at least one of the narrow trenches along the horizontal direction; a horizontal width between upper surfaces of hardmasks of adjacent features along the horizontal direction; a height of at least one of the isolation trenches along the vertical direction; and a vertical width between upper surfaces of hardmasks of adjacent features along the vertical direction, or a combination thereof. Some aspects include: forming an oxide in the isolation and narrow trenches; removing the hardmask layers to expose a surface of the active regions of each of the features; and initiating a second scatterometry after forming the oxide and removing the hardmask layers. Additional aspects include the features being rectangular with each side having a width of between 20 nm and 1000 nm, wherein the narrow distance is 50 nm to 100 nm and the isolation distance is greater than 400 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of characteristics of isolated structures being neglected by standard scatterometry. In accordance with embodiments of the present disclosure, scattering spectra is determined based on a scatterometry performed on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction.

Methodology in accordance with embodiments of the present disclosure includes: initiating scatterometry on a fabricated test structure including a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, the second distance being substantially larger than the first distance; determining, by a processor, a scattering spectra corresponding to one or more physical characteristics of the fabricated test structure based on results of the scatterometry; and associating the scattering spectra with the one or more physical characteristics in a library for estimating physical dimensions of a fabricated structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
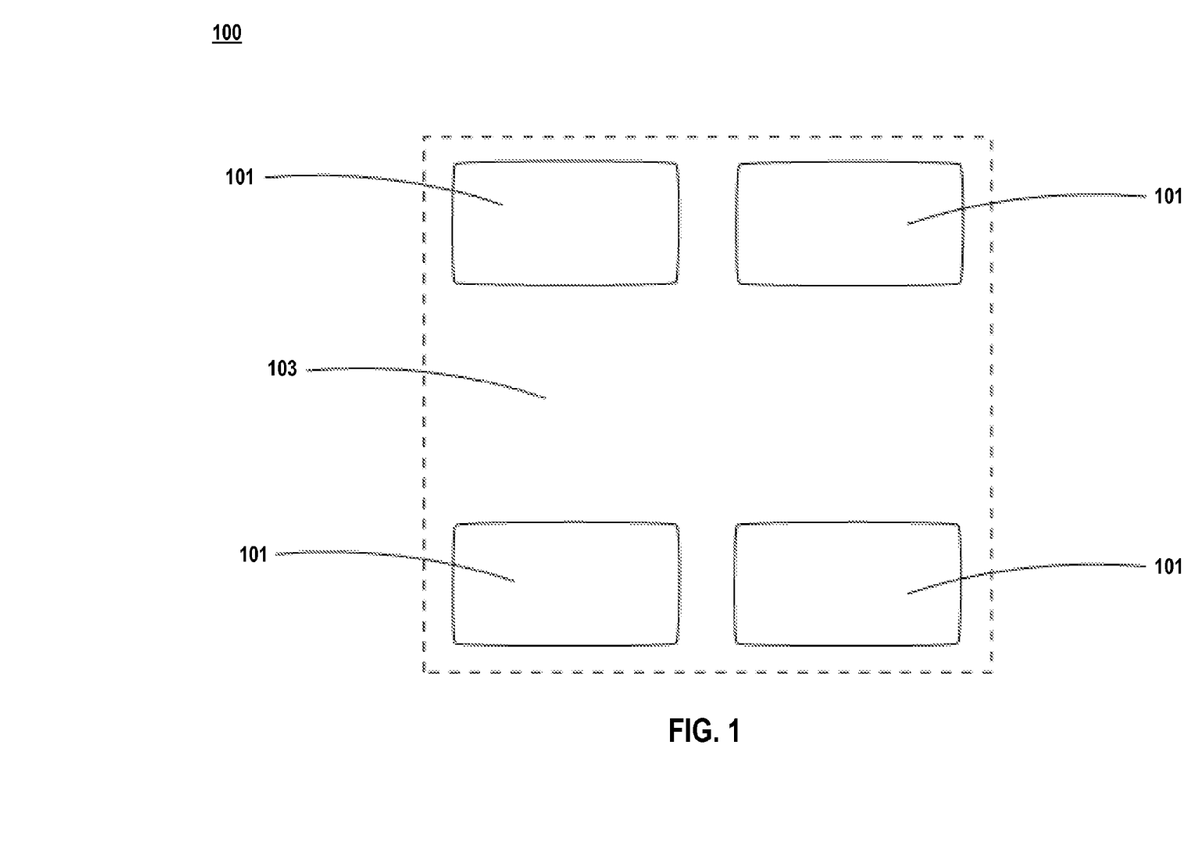
FIG. 1 illustrates a fabricated test structure, according to an exemplary embodiment.

FIG. 1 illustrates a two-dimensional test array 100 to be used for characterization of critical STI structural parameters by a metrological technique of scatterometry. As shown, the test array 100 includes structures 101 (e.g., features) resulting from performing a STI patterning process that are surrounded by an etched trench region 103. The structures 101 may be square or rectangular in shape with sides between 20 nm and 1,000 nm.

Figure 2A:
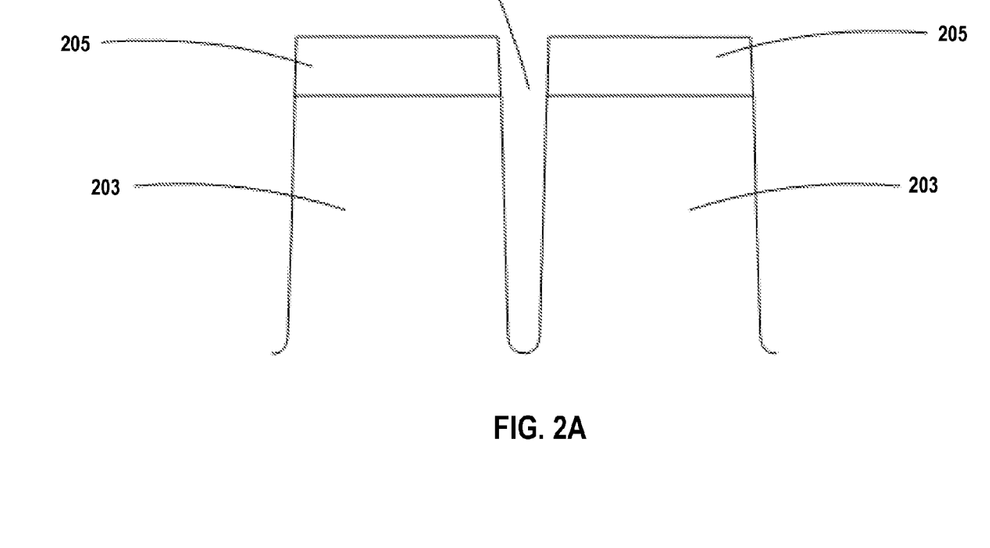
FIGS. 2A and 2B illustrate a nested cross sectional view of a fabricated test structure, in accordance with an exemplary embodiment.
Figure 2B:
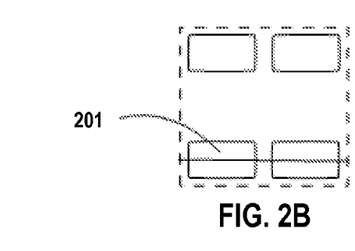

FIG. 2A illustrates a cross sectional view along cut 201 as shown in FIG. 2B (e.g., along a horizontal direction) of test array 100, in accordance with an exemplary embodiment. The cut 201 may be used to display physical feature characteristics of nestedness, for instance, structures that are separated by 100 nm or less (e.g., 50 nm, 50 nm or less). As shown, FIG. 2A includes silicon active areas 203, a silicon nitride hardmask 205 on the silicon active areas 203, and narrow trenches 207 etched through the silicon nitride hardmask 205 into the silicon active areas 203. A thin oxide layer (not shown) may be formed between the silicon nitride hardmask 205 and silicon active areas 203.

Figure 3:
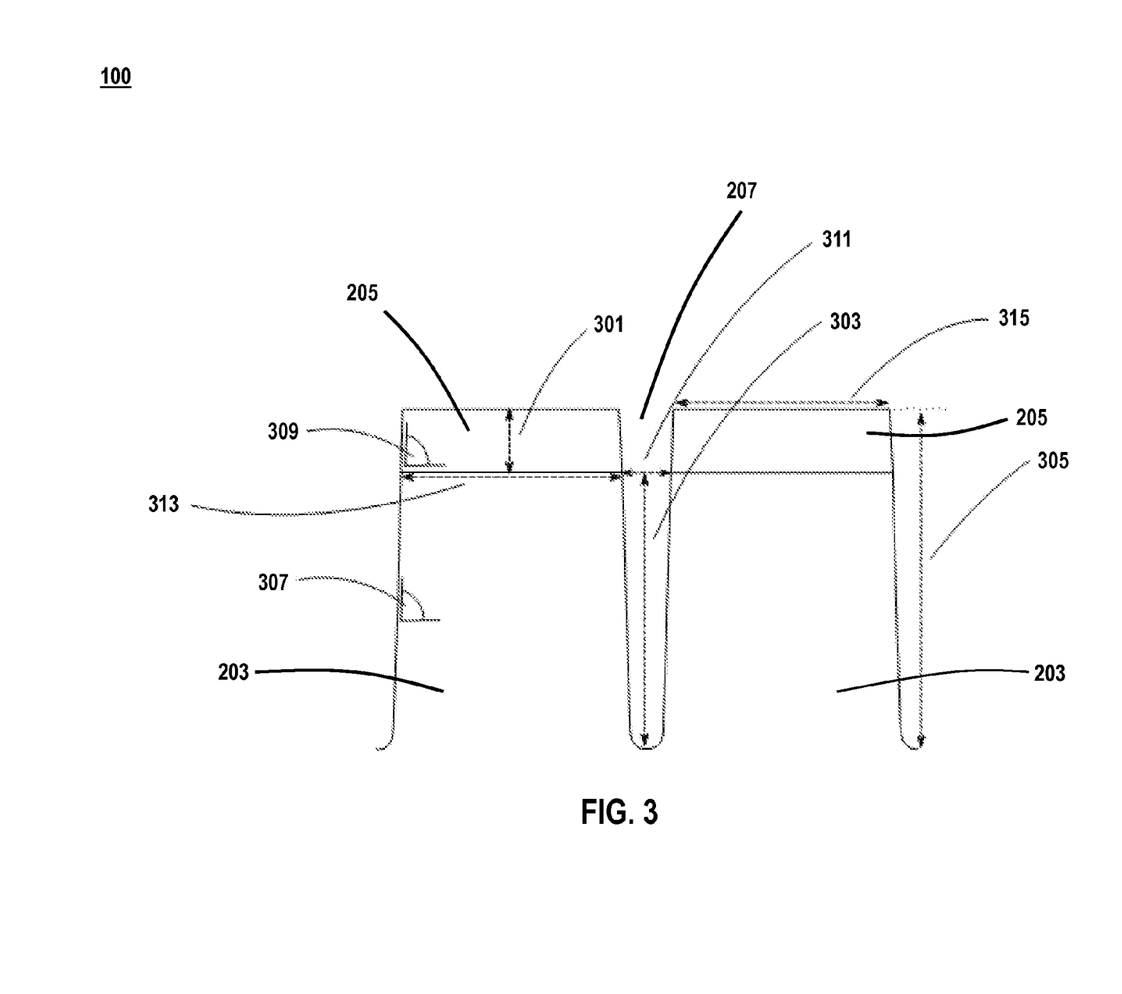
FIG. 3 illustrates various measurable physical parameters of a nested cross sectional view of a fabricated test structure, in accordance with an exemplary embodiment.

FIG. 3 illustrates physical parameters (e.g., physical characteristics) of nestedness measurable by scatterometry, in accordance with an exemplary embodiment. As shown, physical parameters of the cross sectional view of FIG. 2A along cut 201 of test array 100 include a thickness 301 of silicon nitride hardmask 205, a narrow trench depth 303 into silicon active areas 203, a total narrow trench depth 305 into silicon nitride hardmask 205 and silicon active areas 203, a sidewall angle of narrow trench 307 in silicon active areas 203, a sidewall angle of narrow trench 309 in silicon nitride hardmask 205, a narrow trench width 311 at an upper surface of silicon active areas 203, a width 313 at an upper surface of silicon active areas 203, and a width 315 at an upper surface of silicon nitride hardmask 205.

Figure 4A:
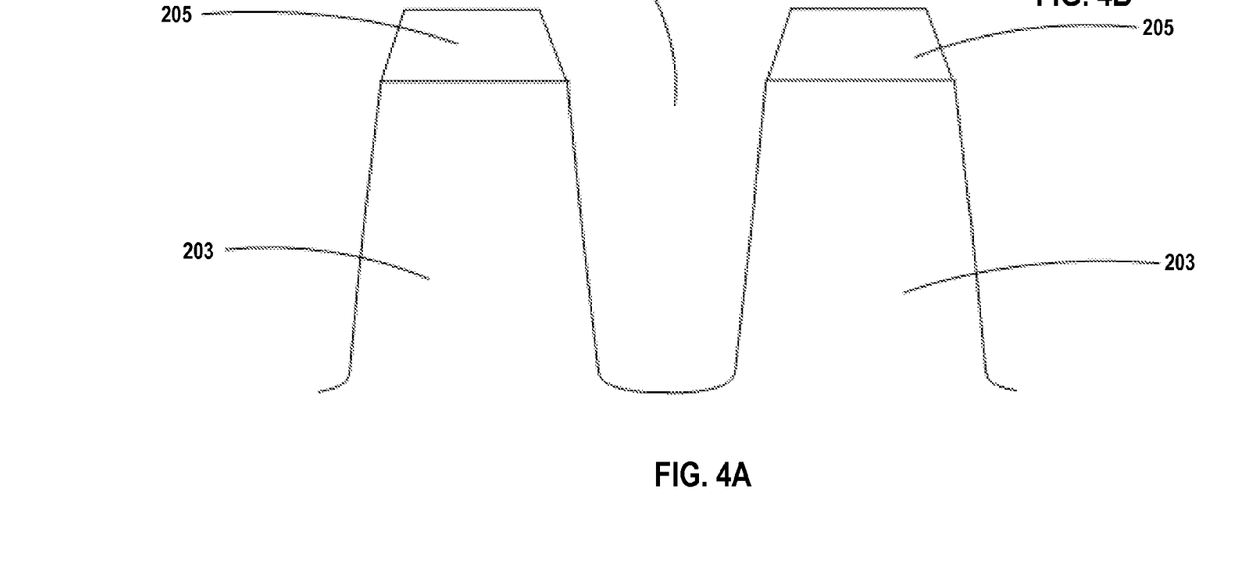
FIGS. 4A and 4B illustrate an isolated cross sectional view of a fabricated test structure, in accordance with an exemplary embodiment.
Figure 4B:
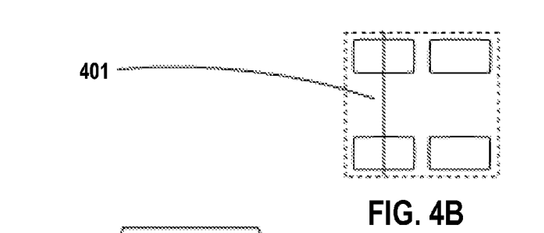

FIG. 4A illustrates a cross sectional view along cut 401 as shown in FIG. 4B (e.g., along a vertical direction) of test array 100, in accordance with an exemplary embodiment. The cut 401 may be used to display physical feature characteristics of isolation, for instance, structures that are separated by more than 400 nm. Similar to FIG. 2A, FIG. 4A includes silicon active areas 203, a silicon nitride hardmask 205 on the silicon active areas 203. However, instead of narrow trenches 207, FIG. 4A includes wide trenches 403 that are etched through the silicon nitride hardmask 205 into the silicon active areas 203. Similar to FIG. 2A, a thin oxide layer (not shown) may be formed between the silicon nitride hardmask 205 and silicon active areas 203 of FIG. 4A.

Figure 5:
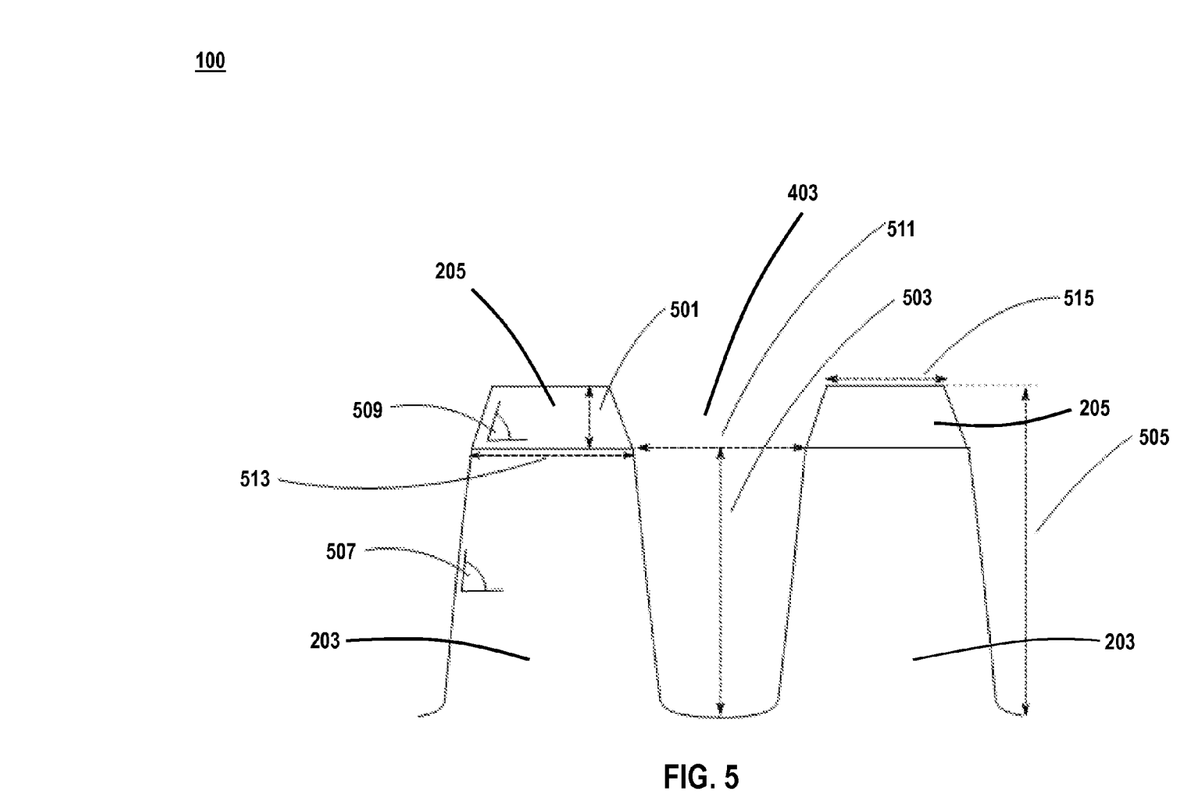
FIG. 5 illustrates various measurable physical parameters of an isolated cross sectional view of a fabricated test structure, in accordance with an exemplary embodiment.

FIG. 5 illustrates physical parameters (e.g., physical characteristics) of isolation measurable by scatterometry, in accordance with an exemplary embodiment. As shown, physical parameters of the cross sectional view of FIG. 4A along cut 401 of test array 100 include a thickness 501 of silicon nitride hardmask 205, a wide trench depth 503 into silicon active areas 203, a total wide trench depth 505 into silicon nitride hardmask 205 and silicon active areas 203, a sidewall angle of narrow trench 507 in silicon active areas 203, a sidewall angle of wide trench 509 in silicon nitride hardmask 205, a wide trench width 511 at an upper surface of silicon active areas 203, a width 513 at an upper surface of silicon active areas 203, and a width 515 at an upper surface of silicon nitride hardmask 205.

Figure 6:
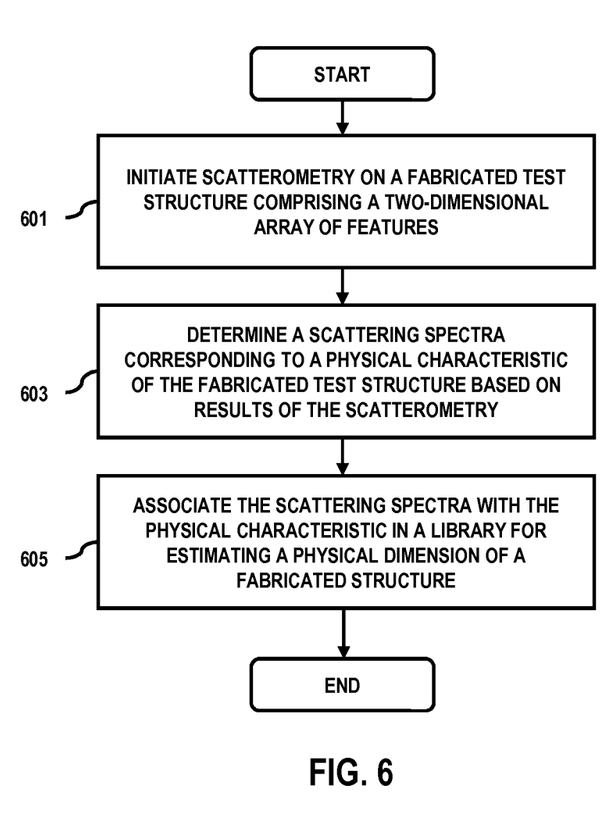
FIG. 6 illustrates a process flow for estimating dimensions for both SRAM and logic areas of fabricated semiconductor devices, in accordance with an exemplary embodiment.

Adverting to FIG. 6, a process flow for enabling (a two-dimensional) scatterometry to be used to estimate dimensions for both SRAM and logic areas of fabricated semiconductor devices is shown, in accordance with an exemplary embodiment of the present disclosure. As illustrated at step 601, a scatterometry on a fabricated test structure is initiated. For instance, a predetermined spectrum of light is provided on the test array 100 of FIGS. 1 through 5. Next, in step 603, a scattering spectra corresponding to a physical characteristic of the test array 100 is determined. By way of example, a scattering spectra resulting from the providing of the predetermined spectrum of light is measured on the test array 100. The measured scattering spectra is associated, as in step 605, with physical characteristics in a library for estimating physical dimensions of a fabricated structure. For instance, the measured scattering spectra is compared with previously calculated spectra in a library, and a (critical) dimension of a fabricated structure is deduced from dimensions associated with matching calculated spectra in the library.

Figure 7A:
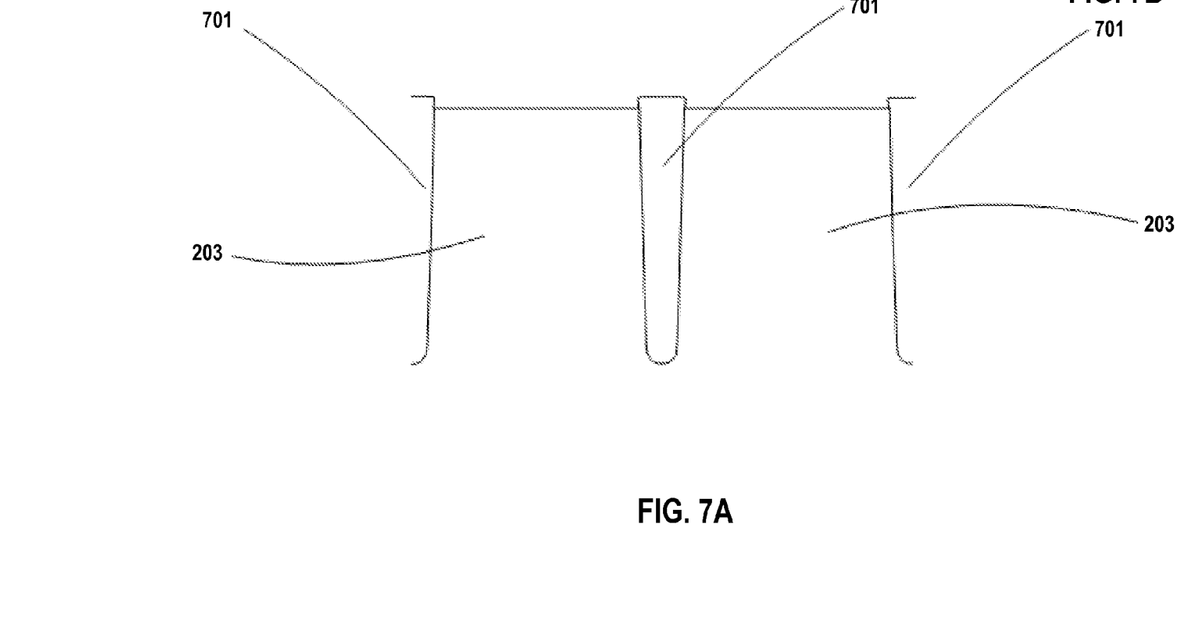
FIGS. 7A and 7B illustrate various measurable physical parameters of a nested cross sectional view of a fabricated test structure after filling etched trenches and removing hardmasks, in accordance with an exemplary embodiment.
Figure 7B:
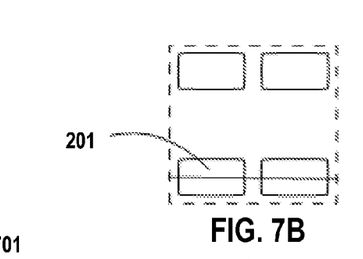

FIG. 7A illustrates a cross sectional view along cut 201 as shown in FIG. 7B of test array 100, in accordance with an exemplary embodiment. As shown, the test array 100 of FIG. 7A further include forming an isolation silicon oxide 701 in the narrow trenches 207, and removing the silicon nitride hardmask 205. Accordingly, the process illustrated in FIG. 6 may be performed on the resulting test array 100 of FIG. 7A. In other words, the various physical parameters of nestedness illustrated in FIG. 3 may be determined and associated with scattering spectra (of a second scatterometry) after forming an isolation silicon oxide 701 in the narrow trenches 207, and removing the silicon nitride hardmask 205.

Additionally, the test array 100 of FIG. 4A may further include an isolation silicon oxide 701 formed in the wide trenches 403 with the silicon nitride hardmask 205 removed (not shown). Accordingly, the process illustrated in FIG. 6 may be performed on the resulting test array 100 of FIG. 4A. In other words, the various physical parameters of isolation illustrated in FIG. 5 may be determined and associated with scattering spectra (of a second scatterometry) after the forming an isolation silicon oxide 701 in the wide trenches 403, and removing the silicon nitride hardmask 205.

Figure 8:
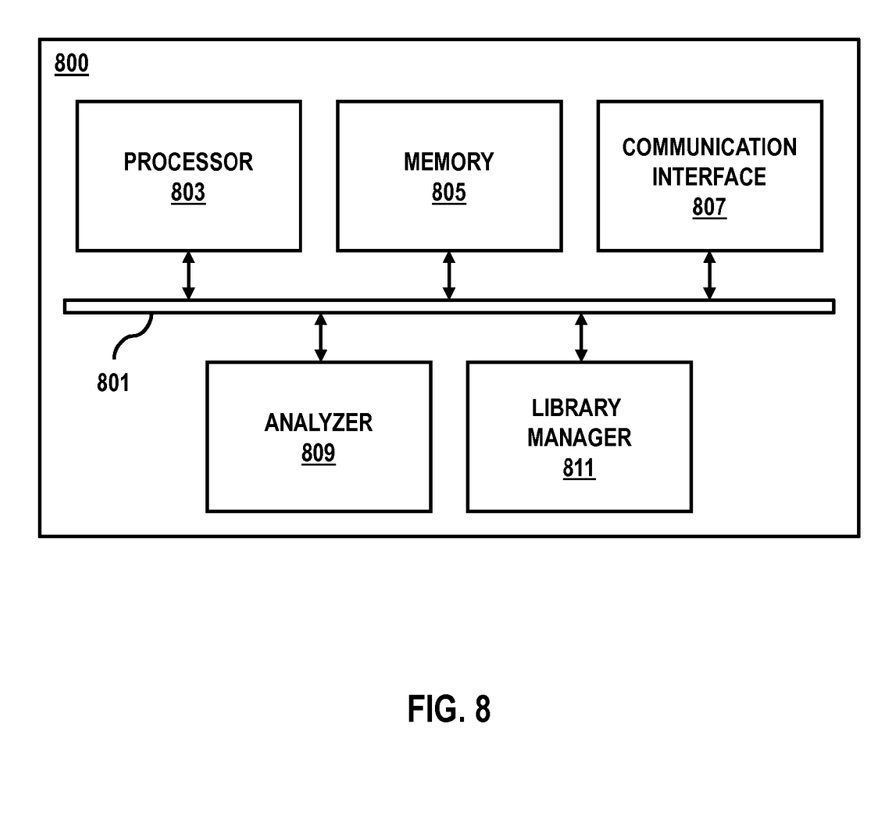
FIG. 8 schematically illustrates a computer system for estimating dimensions for both SRAM and logic areas of fabricated semiconductor devices, in accordance with an exemplary embodiment.

FIG. 8 schematically illustrates a computer system 800 upon which an exemplary embodiment of the invention may be implemented. Computer system 800 may, for instance, be programmed (e.g., via computer program code or instructions) to initiate scatterometry on a test structure, determine a scattering spectra corresponding to a physical characteristic, and associate the scattering spectra with a physical characteristic in a library for estimating a physical dimension of a fabricated structure, for instance, as illustrated in FIGS. 3 and 5, as described herein and may include a communication mechanism such as a bus 801 for passing information between other internal and external components of the computer system 800. Moreover, computer system 800 may include a processor (or multiple processors) 803 for performing a set of operations on information as specified by computer program code related to measuring scattering spectra and estimating physical dimensions. Computer system 800 may also include memory 805 coupled to bus 801. The memory 805 may, for instance, include dynamic storage, static storage, or a combination thereof for storing calculated scattering spectra and associated physical dimensions.

Processor 803 may perform a scatterometry measurement on a fabricated test structure and may thereafter monitor, calculate, record, etc. scattering spectra for each measurement. By way of example, based on computer program code in memory 805, processor 803 may interact with communication interface 807 and may then work with analyzer 809 to monitor and record scattering spectra for a test array (e.g., 100). Library Manager 811 may compare the measured scattering spectra with previously calculated spectra in a library and associate the measured scattering spectra with an estimated (critical) dimension in a database, for instance, matching calculated scattering spectra in the library.

It is noted that, in various aspects, some or all of the techniques described herein are performed by computer system 800 in response to processor 803 executing one or more sequences of one or more processor instructions contained in memory 805. Such instructions, also called computer instructions, software and program code, may be read into memory 805 from another computer-readable medium such as a storage device or a network link. Execution of the sequences of instructions contained in memory 805 causes processor 803 to perform one or more of the method steps described herein. In alternative embodiments, hardware, such as application-specific integrated circuits (ASICs), may be used in place of or in combination with software to implement the invention. Thus, embodiments of the invention are not limited to any specific combination of hardware and software, unless otherwise explicitly stated herein.

The embodiments of the present disclosure can achieve several technical effects including an estimation of physical dimensions of a fabricated semiconductor device. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 28 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    initiating scatterometry on a fabricated test structure comprising a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, the second distance being substantially larger than the first distance;
    determining, by a processor, a scattering spectra corresponding to one or more physical characteristics of the fabricated test structure based on results of the scatterometry; and
    associating the scattering spectra with the one or more physical characteristics in a library for estimating at least one physical dimension of a fabricated structure.

2. The method according to claim 1, wherein the one or more physical characteristics comprises a topography of an upper surface of the fabricated test structure along the horizontal or the vertical direction.

3. The method according to claim 1, wherein each of the features comprises an active region layer and a hardmask layer on the active region layer.

4. The method according to claim 3, wherein the one or more physical characteristics include a height of at least one of the active region layers along the horizontal or vertical direction, a combined height of at least one of the active region layers and a respective hardmask layer along the horizontal or vertical direction, a width of an upper surface of at least one of the hardmask layers along the horizontal or vertical direction, a width of an upper surface of at least one of the active region layers along the horizontal or vertical direction, a sidewall angle of at least one of the hardmask layers along the horizontal or vertical direction, a sidewall angle of at least one of the active region layer along the horizontal or vertical direction, or a combination thereof.

5. The method according to claim 3, wherein the narrow and isolation trenches correspond to shallow trench isolation regions separating active regions of a static random access memory (SRAM) and a logic area, respectively.

6. The method according to claim 3, wherein the one or more physical characteristics include a height of at least one of the narrow trenches along the horizontal direction, a horizontal width between upper surfaces of hardmasks of adjacent features along the horizontal direction, a height of at least one of the isolation trenches along the vertical direction, a vertical width between upper surfaces of hardmasks of adjacent features along the vertical direction, or a combination thereof.

7. The method according to claim 3, further comprising forming an oxide in the isolation and narrow trenches, removing the hardmask layers to expose a surface of the active regions of each of the features, and initiating a second scatterometry after forming the oxide and removing the hardmask layers.

8. The method according to claim 1, further comprising:
the scatterometry being a two-dimensional scatterometry; and
the features being rectangular with each side having a width of between 20 nanometer (nm) and 1000 nm, wherein the first distance is 50 nm to 100 nm and the second distance is greater than 400 nm.

9. The method according to claim 1, further comprising:
the features being rectangular with each side having a width of between 20 nm and 1000 nm, wherein the narrow distance is 50 nm to 100 nm and the isolation distance is greater than 400 nm.

10. An apparatus comprising:
a processor; and
memory including computer program code for a program, the memory and the computer program code configured to, with the processor, cause the apparatus to perform at least the following,
initiate scatterometry on a fabricated test structure comprising a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, the second distance being substantially larger than the first distance;
determine a scattering spectra corresponding to one or more physical characteristics of the fabricated test structure based on results of the scatterometry; and
associate the scattering spectra with the one or more physical characteristics in a library for estimating at least one physical dimension of a fabricated structure.

11. The apparatus according to claim 10, wherein the one or more physical characteristics comprises a topography of an upper surface of the fabricated test structure along the horizontal or the vertical direction.

12. The apparatus according to claim 10, wherein each of the features comprises an active region layer and a hardmask layer on the active region layer.

13. The apparatus according to claim 12, wherein the one or more physical characteristics include a height of at least one of the active region layers along the horizontal or vertical direction, a combined height of at least one of the active region layers and a respective hardmask layer along the horizontal or vertical direction, a width of an upper surface of at least one of the hardmask layers along the horizontal or vertical direction, a width of an upper surface of at least one of the active region layers along the horizontal or vertical direction, a sidewall angle of at least one of the hardmask layers along the horizontal or vertical direction, a sidewall angle of at least one of the active region layer along the horizontal or vertical direction, or a combination thereof.

14. The apparatus according to claim 12, wherein the narrow and isolation trenches correspond to shallow trench isolation regions separating active regions of a static random access memory (SRAM) and a logic area, respectively.

15. The apparatus according to claim 12, wherein the one or more physical characteristics include a height of at least one of the narrow trenches along the horizontal direction, a horizontal width between upper surfaces of hardmasks of adjacent features along the horizontal direction, a height of at least one of the isolation trenches along the vertical direction, a vertical width between upper surfaces of hardmasks of adjacent features along the vertical direction, or a combination thereof.

16. The apparatus according to claim 12, wherein the apparatus is further caused to form an oxide in the isolation and narrow trenches, remove the hardmask layers to expose a surface of the active regions of each of the features, and initiate a second scatterometry after forming the oxide and removing the hardmask layers.

17. The apparatus according to claim 12, wherein the scatterometry is a two-dimensional scatterometry, and the features are rectangular with each side having a width of between 20 nanometer (nm) and 1000 nm, wherein the first distance is 50 nm to 100 nm and the second distance is greater than 400 nm.

18. A method comprising:
initiating a two-dimensional scatterometry on a fabricated test structure comprising a two-dimensional array of features, each of the features being horizontally separated from an adjacent one of the features by a narrow trench region extending a first distance in a horizontal direction and each of the features being vertically separated from an adjacent one of the features by an isolated trench region extending a second distance in a vertical direction, wherein the second distance is substantially larger than the first distance, and the narrow and isolation trenches correspond to shallow trench isolation regions separating active regions of a static random access memory (SRAM) and a logic area, respectively, of a fabricated structure;
determining, by a processor, a first scattering spectra corresponding to a first topography of an upper surface of the fabricated test structure along the horizontal direction based on results of the scatterometry;
determining, by the processor, a second scattering spectra corresponding to a second topography of an upper surface of the fabricated test structure along the vertical direction based on results of the scatterometry; and
associating the first scattering spectra and second scattering spectra with the first and second topographies, respectively, in a library for estimating at least one physical dimension of the SRAM and/or logic area.

19. The method according to claim 18, wherein the first topography and/or second topography include one or more of the following:
a height of at least one of the active region layers along the horizontal or vertical direction;

a combined height of at least one of the active region layers and a respective hardmask layer along the horizontal or vertical direction;
a width of an upper surface of at least one of the hardmask layers along the horizontal or vertical direction;
a width of an upper surface of at least one of the active region layers along the horizontal or vertical direction;
a sidewall angle of at least one of the hardmask layers along the horizontal or vertical direction;
a sidewall angle of at least one of the active region layer along the horizontal or vertical direction, or a combination thereof;
a height of at least one of the narrow trenches along the horizontal direction;
a horizontal width between upper surfaces of hardmasks of adjacent features along the horizontal direction;
a height of at least one of the isolation trenches along the vertical direction; and
a vertical width between upper surfaces of hardmasks of adjacent features along the vertical direction, or a combination thereof.

20. The method according to claim 18, further comprising:
forming an oxide in the isolation and narrow trenches;
removing the hardmask layers to expose a surface of the active regions of each of the features; and
initiating a second scatterometry after forming the oxide and removing the hardmask layers.

* * * * *